(12) United States Patent
Washio et al.

(10) Patent No.: US 6,838,229 B2
(45) Date of Patent: Jan. 4, 2005

(54) CHEMICALLY AMPLIFIED NEGATIVE PHOTORESIST COMPOSITION FOR THE FORMATION OF THICK FILMS, PHOTORESIST BASE MATERIAL AND METHOD OF FORMING BUMPS USING THE SAME

(75) Inventors: Yasushi Washio, Kanagawa (JP); Koji Saito, Kanagawa (JP); Toshiki Okui, Kanagawa (JP); Hiroshi Komano, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 192 days.

(21) Appl. No.: 10/194,298

(22) Filed: Jul. 15, 2002

(65) Prior Publication Data
US 2003/0039921 A1 Feb. 27, 2003

(30) Foreign Application Priority Data
Jul. 30, 2001 (JP) ........................................ 2001-229680

(51) Int. Cl.$^7$ ............................ G03F 7/038; G03F 7/38
(52) U.S. Cl. .................... 430/324; 430/270.1; 430/905; 430/914; 430/927
(58) Field of Search ............................. 430/270.1, 324, 430/914, 905, 927

(56) References Cited

U.S. PATENT DOCUMENTS

| | | | | |
|---|---|---|---|---|
| 5,494,777 A | * | 2/1996 | Shiraki et al. ........... | 430/270.1 |
| 5,529,885 A | * | 6/1996 | Ochiai et al. ................ | 430/927 |
| 5,609,988 A | * | 3/1997 | Miyamoto et al. ........ | 430/270.1 |
| 5,942,369 A | | 8/1999 | Ota et al. | |
| 5,955,241 A | * | 9/1999 | Sato et al. ................ | 430/270.1 |
| 6,399,275 B1 | * | 6/2002 | Sugeta et al. ............ | 430/270.1 |
| 6,576,394 B1 | * | 6/2003 | Xu et al. .................. | 430/270.1 |
| 6,673,512 B1 | * | 1/2004 | Uenishi et al. .......... | 430/270.1 |

FOREIGN PATENT DOCUMENTS

| | | | |
|---|---|---|---|
| JP | 4-186248 | * | 6/1999 |
| JP | 2000-066386 | * | 3/2000 |
| JP | 2000-039709 | * | 8/2000 |
| JP | 2001-209179 | * | 8/2001 |

OTHER PUBLICATIONS

Derwent No. 2002–150652, Dec. 5, 2002; Ahsti of Kr 2001051692, Korea, published Jun. 25, 2001.*

* cited by examiner

*Primary Examiner*—Richard L. Schilling
(74) *Attorney, Agent, or Firm*—Sughrue Mion, PLLC

(57) ABSTRACT

A chemically amplified negative photoresist composition is used for the formation of thick films having a thickness of 20 to 150 $\mu$m and includes (A) an alkali-soluble resin, (B) a compound which generates an acid upon irradiation with active light or radiant ray, and (C) a compound which serves as a crosslinking agent in the presence of an acid. The alkali-soluble resin (A) includes (a1) a novolak resin having a weight average molecular weight of from 5000 to 10000, and (a2) a polymer containing at least a hydroxystyrene constitutional unit and having a weight average molecular weight of less than or equal to 5000.

21 Claims, No Drawings

CHEMICALLY AMPLIFIED NEGATIVE PHOTORESIST COMPOSITION FOR THE FORMATION OF THICK FILMS, PHOTORESIST BASE MATERIAL AND METHOD OF FORMING BUMPS USING THE SAME

BACKGROUND OF THE INVENTION

1. Field of the Invention

The present invention relates to a chemically amplified negative photoresist composition for use in the formation of thick films, to a photoresist base material and to a method of forming bumps using the photoresist base material. More specifically, the invention relates to an alkali-developable chemically amplified negative photoresist composition for the formation of thick films, which is suitable for photofabrication such as bump formation, wiring, metal post formation, interlayer insulating film formation, circuit protective film formation and processing and manufacture of precision parts, carried out when circuit substrates are manufactured and semiconductors and electronic parts are packaged on the circuit substrates such as in chip size package (CSP).

2. Description of the Related Art

The photofabrication is a generic term for techniques in which a photosensitive resin composition is applied to the surfaces of process articles and the coating films formed are patterned by photolithography, followed by chemical etching or electrolytic etching using the patterns as masks, or electroforming chiefly using electroplating, any of which are applied alone or in combination, to fabricate various precision parts. This is prevalent in the current high-precision microfabrication techniques.

With the downsizing of electronic equipment, there is a rapid progress toward higher integration of LSIs, and a demand has been made on higher density of packaging based on multipin thin-film packaging for mounting LSIs on electronic equipment, downsizing of packaging and two-dimensional or three-dimensional packaging techniques by flip-chip system. In such high density packaging, protruded electrodes of 20 µm or more in height, called bumps serving as connecting terminals, rewiring between peripheral terminals on the wafer and the connecting terminals and very thick film wiring called as metal post must be highly precisely arranged on the substrate, and it has become more required to make the bumps higher in precision so as to be adaptable to any further miniaturization of LSIs in future.

Photoresists for the formation of thick films are used as materials for the package fabrication or IC bumping process. The term "thick films" used herein means and includes films having a thickness of from 20 to 150 µm. Using such a patterned thick film as a mask, bumps or metal posts are formed by plating process, and lead frames are formed by metal etching process. The pattered thick film is also used as a mask in dry etch process.

For example, Japanese Patent Laid-Open Nos. 10-207057, 2000-39709 and 2000-66386 disclose thick-film photosensitive resin compositions which are used for the formation of bumps or for wiring. These conventional thick-film photosensitive resin compositions require large amounts of reaction initiators in order to sufficiently react overall of the resulting resist films each having a large thickness. However, large amounts of reaction initiators may deteriorate compatibility or stability in preservation. Demands have therefore been made on reaction initiators having higher sensitivity.

Chemically amplified resists containing acid generators have been used as photosensitive resist compositions having high sensitivity. In these chemically amplified resists, a protonic acid is generated from the constitutive acid generator upon irradiation of active light or radiant ray and then induces an acid catalytic reaction with a base resin in the resin composition as a result of heat treatment after exposure. Thus, the chemically amplified resists have significantly higher sensitivity than conventional resists each having a photoreaction efficiency (a reaction per photon) of less than 1. As an example of chemically amplified negative resists, L. E. Bogan et al. disclose a resist containing a polyvinylphenol and a melamine derivative in combination in Proceeding of SPIE, 1086, 34–47 (1989). However, when thick films are formed using these chemically amplified resists, the resulting thick films invite cracking and do not exhibit required plating resistance.

To exposure such conventional photoresists for the formation of thick films (hereinafter briefly referred to as "thick-film resists" or "thick-film photoresists"), a contact exposure process, in which portions to be exposed are in contact with the resist, has been used in many cases in order to avoid diffusion of light during exposure. However, proximity exposure (gap exposure), in which the portions to be exposed are in the proximity of but not in contact with the resist, is advantageous from the viewpoint of manufacturing process. A demand has therefore been made on thick film resists that have sufficient performances even when used in the proximity exposure process.

SUMMARY OF THE INVENTION

Accordingly, an object of the present invention is to provide a chemically amplified negative photoresist composition for the formation of thick films, which has high sensitivity and satisfactory plating resistance and is suitable as a material for the formation of bumps, rewiring and metal posts or as a material for use in CSP, as well as to provide a photoresist base material and a method of forming bumps using the photoresist base material.

Specifically, the present invention provides a chemically amplified negative photoresist composition for the formation of thick films including (A) an alkali-soluble resin, (B) a compound which generates an acid upon irradiation with active light or radiant ray, and (C) a compound which serves as a crosslinking agent in the presence of an acid. The alkali-soluble resin (A) includes (a1) a novolak resin having a weight average molecular weight of from 5000 to 10000, and (a2) a polymer containing at least a hydroxystyrene constitutional unit and having a weight average molecular weight of less than or equal to 5000.

In the composition, the ingredient (a1) is preferably a m-cresol novolak resin obtained by condensation of m-cresol and an aldehyde in the presence of an acid catalyst.

In the composition, the ingredient (A) preferably includes 50 to 98 parts by weight of the ingredient (a1) and 50 to 2 parts by weight of the ingredient (a2) based on 100 parts by weight of the total weight of the ingredients (a1) and (a2).

The ingredient (B) in the chemically amplified negative photoresist composition is preferably a compound having at least two oxime sulfonate groups represented by the following formula:

wherein R is a substituted or unsubstituted alkyl group or aryl group.

In this case, the ingredient (B) is more preferably a compound represented by the following formula:

R—SO$_2$O—N=C(CN)-A-C(CN)=N—OSO$_2$—R wherein A is a divalent organic group; and R is a substituted or unsubstituted alkyl group or aryl group.

In the ingredient (B) just mentioned above, the group A is preferably a phenylene group and the substituent R is preferably a lower alkyl group.

The content of the ingredient (B) in the composition is preferably from 0.1 to 1 part by weight based on 100 parts by weight of the total weight of the ingredients (A), (B) and (C).

In another aspect, the present invention provides a negative photoresist base material including a substrate and a negative photoresist layer. The negative photoresist layer is formed on the substrate, includes the aforementioned chemically amplified negative photoresist composition for the formation of thick films and has a film thickness of from 20 to 150 μm.

In addition and advantageously, the present invention provides a method of forming bumps. The method includes the steps of applying the chemically amplified negative photoresist composition to a substrate of an electronic part to thereby form a resist film as a coating; selectively exposing the resist film; heating the exposed resist film; developing the heated resist film to thereby form a negative resist pattern; and plating the portions from which the resist film has been removed using the resist pattern as a mask.

Thus, the negative photoresist composition of the present invention has high sensitivity and satisfactory plating resistance, is suitable for the formation of thick films and is advantageous as a material for the formation of bumps, rewiring and metal posts for use in manufacture by CSP process, as well as a photoresist base material and a method of forming bumps using the photoresist base material.

DETAILED DESCRIPTION OF THE INVENTION

After intensive investigations to achieve the above objects, the present inventors have found that characteristics required of a resist differ depending on the type of a plating solution, that the objects are achieved by optimizing the components of the resist and that the resulting chemically amplified negative photoresist composition for the formation of thick films can advantageously be used in solder plating and copper plating process.

The composition of the present invention will be described in detail below.

Alkali-Soluble Resins (A)

Alkali-soluble resins for use as the ingredient (A) in the present invention are mixtures of (a1) a novolak resin having a weight average molecular weight ranging from 5000 to 10000 and (a2) a polymer containing at least a hydroxystyrene constitutional unit and having an average molecular weight less than or equal to 5000.

Novolak Resins (a1)

The novolak resins (a1) for use in the present invention can be obtained, for example, by addition condensation of aromatic compounds each having a phenolic hydroxyl group (hereinafter briefly referred to as "phenols") with aldehydes in the presence of acid catalysts. Such phenols include, but are not limited to, phenol, o-cresol, m-cresol, p-cresol, o-ethylphenol, m-ethylphenyl, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic esters, α-naphthol, and β-naphthol. The aldehydes include, but are not limited to, formaldehyde, paraformaldehyde, furfural, benzaldehyde, nitrobenzaldehyde, and acetaldehyde. Catalysts for use in the addition condensation are not specifically limited and include acid catalysts such as hydrochloric acid, nitric acid, sulfuric acid, formic acid, oxalic acid, and acetic acid.

The average molecular weight of the novolak resin (a1) is preferably from about 5000 to 10000. Specifically, m-cresol novolak resins obtained by condensation of m-cresol with aldehydes are suitable for use in chemically amplified negative photoresist compositions for the formation of thick films.

Polymers (a2) Having a Hydroxystyrene Constitutional Unit

Polymers for use as the polymer (a2) in the present invention are polymers each having at least a hydroxystyrene constitutional unit.

Such polymers include, but are not limited to, radical or ionic polymers of p-hydroxystyrene and other hydroxystyrene monomers, α-methylhydroxystyrene, α-ethylhydroxystyrene, and other a-alkylhydroxystyrene monomers; and copolymers comprising a hydroxystyrene constitutional unit such as hydroxy styrene or α-alkylhydroxystyrene and a constitutional unit other than the hydroxystyrene constitutional unit. Preferred monomers for constituting the constitutional unit other than the hydroxystyrene constitutional unit are monomers in which the hydroxyl group of the hydroxystyrene is substituted with another group or monomers each having α,β-unsaturated double bond. Such another group for substituting the hydroxyl group of hydroxystyrene includes basic dissolution inhibiting groups that are not decomposed by action of an acid. The basic dissolution inhibiting groups include, for example, substituted or unsubstituted benzenesulfonyloxy groups, substituted or unsubstituted naphthalenesulfonyloxy groups, substituted or unsubstituted benzenecarbonyloxy groups, and substituted or unsubstituted naphthalenecarbonyloxy groups. Examples of the substituted or unsubstituted benzenesulfonyloxy groups are benzenesulfonyloxy group, chlorobenzenesulfonyloxy group, methylbenzenesulfonyloxy group, ethylbenzenesulfonyloxy group, propylbenzenesulfonyloxy group, methoxybenzenesulfonyloxy group, ethoxybenzenesulfonyloxy group, propoxybenzenesulfonyloxy group, and acetaminobenzenesulfonyloxy group. The substituted or unsubstituted naphthalenesulfonyloxy groups include, for example, naphthalenesulfonyloxy group, chloronaphthalenesulfonyloxy group, methylnaphthalenesulfonyloxy group, ethylnaphthalenesulfonyloxy group, propylnaphthalenesulfonyloxy group, methoxynaphthalenesulfonyloxy group, ethoxynaphthalenesulfonyloxy group, propoxynaphthalenesulfonyloxy group, and acetaminonaphthalenesulfonyloxy group. Examples of the substituted or unsubstituted benzenecarbonyloxy groups and substituted or unsubstituted naphthalenecarbonyloxy groups are groups corresponding to the substituted or unsubstituted benzenesulfonyloxy groups and naphthalenesulfonyloxy groups in which the sulfonyloxy groups are substituted with carbonyloxy groups. Among them, acetaminobenzenesulfonyloxy group and acetaminonaphthalenesulfonyloxy group are preferred.

The monomers each having an α,β-unsaturated double bond include, but are not limited to, styrene, chlorostyrene, chloromethylstyrene, vinyltoluene, α-methylstyrene, and other styrenic monomers; methyl acrylate, methyl methacrylate, phenyl methacrylate, and other acrylic monomers; vinyl acetate, vinyl benzoate, and other vinyl monomers, of which styrene is typically preferred. Polymers obtained from a hydroxystyrene and a styrene, such as copoly(4-hydroxystyrene-styrene) and copoly(4-hydroxystyrene-methylstyrene), exhibit high definition, have high heat resistance and are preferable.

The polymer (a2) has a weight average molecular weight of less than or equal to 5000 and preferably less than or equal to 4000. If the average molecular weight exceeds 5000, the resulting composition may have deteriorated definition.

The ingredient (A) comprises preferably from 50 to 98 parts by weight, more preferably from 55 to 95 parts by weight, of the ingredient (a1) and preferably from 50 to 2 parts by weight, more preferably from 45 to 5 parts by weight, of the ingredient (a2) relative to 100 parts by weight of the total weight of the ingredients (a1) and (a2). The ingredient (A) comprising the ingredients (a1) and (a2) in the ratio as above is suitable for use in a chemically amplified negative photoresist composition for the formation of thick films.

Compounds (B) Which Generate Acids upon Irradiation of Active Light or Radiant Ray The compounds for use as the ingredient (B) in the present invention are acid generators and are not specifically limited, as long as they can directly or indirectly generate an acid upon irradiation of light or radiant ray. Such compounds include, but are not limited to, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis(trichloromethyl)-6-(3-bromo-4-methoxy)phenyl-s-triazine, 2,4-bis(trichloromethyl)-6-(2-bromo-4-methoxy)phenyl-s-triazine, 2,4-bis(trichloromethyl)-6-(2-bromo-4-methoxy)styrylphenyl-s-triazine, 2,4-bis(trichloromethyl)-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine, and other halogen-containing triazine compounds; tris(2,3-dibromopropyl) isocyanurate and other halogen-containing isocyanurate compounds represented by the following formula:

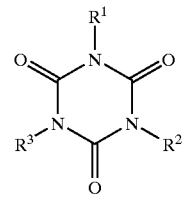

wherein $R^1$, $R^2$ and $R^3$ are the same or different and are each a halogenated alkyl group;

α-(p-toluenesulfonyloximino)-phenylacetonitrile, α-(benzenesulfonyloximino)-2,4-dichlorophenylacetonitrile, α-(benzenesulfonyloximino)-2,6-dichlorophenylacetonitrile, α-(2-chlorobenzenesulfonyloximino)-4-methoxyphenylacetonitrile, α-(ethylsulfonyloximino)-1-cyclopentenylacetonitrile; and compounds represented by the following formula:

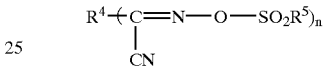

wherein $R^4$ is a monovalent, divalent or trivalent organic group; $R^5$ is a substituted or unsubstituted, saturated hydrocarbon group, unsaturated hydrocarbon group or aromatic compound group; and n is a natural number of from 1 to 3. The term "aromatic compound group" as used herein means and includes groups of compounds exhibiting physical and chemical properties specific to aromatic compounds, such as phenyl group, naphthyl group and other aromatic hydrocarbon groups; and furyl group, thienyl group and other heterocyclic groups. These groups may each have one or more appropriate substituents on its ring. Such substituents include, for example, halogen atoms, alkyl groups, alkoxy groups and nitro group. As the group $R^5$ preferred are lower alkyl groups each containing from 1 to 4 carbon atoms, such as methyl group, ethyl group, propyl group, and butyl group. Among these compounds of the formula, compounds in which $R^4$ is an aromatic compound group and $R^5$ is a lower alkyl group are preferred. When n is 1, examples of the acid generators represented by the formula are compounds of the formula wherein $R^4$ is any of phenyl group, methylphenyl group or methoxyphenyl group and $R^5$ is a methyl group, such as α-(methylsulfonyloximino)-1-phenylacetonitrile, α-(methylsulfonyloximino)-1-(p-methylphenyl)acetonitrile, and α-(methylsulfonyloximino)-1-(p-methoxyphenyl)acetonitrile. Examples of the acid generators represented by the formula, wherein n is 2, are acid generators represented by the following formulae:

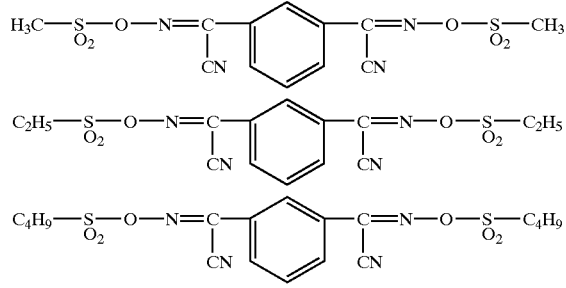

-continued

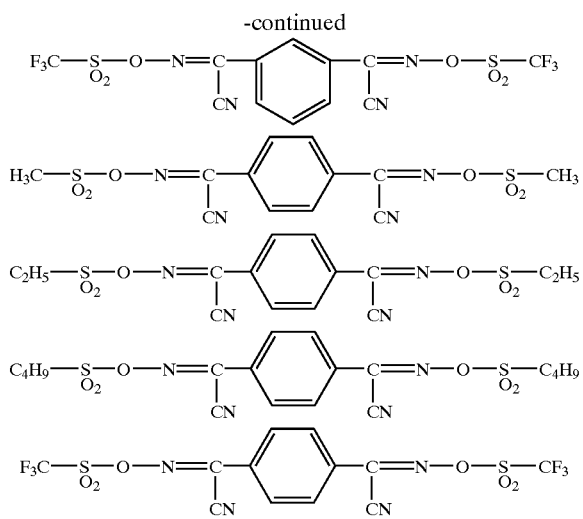

The compounds (B) also include, for example, bis(p-toluenesulfonyl)diazomethane, bis(1,1-dimethylethylsulfonyl)diazomethane, bis(cyclohexylsulfonyl) diazomethane, bis(2,4-dimethylphenylsulfonyl)diazomethane, and other bissulfonyldiazomethanes; 2-nitrobenzyl p-toluenesulfonate, 2,6-nitrobenzyl p-toluenesulfonate, nitrobenzyl tosylate, dinitrobenzyl tosylate, nitrobenzyl sulfonate, nitrobenzyl carbonate, dinitrobenzyl carbonate, and other nitrobenzyl derivatives; pyrogallol trimesylate, pyrogallol tritosylate, benzyl tosylate, benzyl sulfonate, N-methylsulfonyloxysuccinimide, N-trichloromethylsulfonyloxysuccinimide, N-phenylsulfonyloxymaleimide, N-methylsulfonyloxyphthalimide, and other sulfonic acid esters; trifluoromethanesulfonic acid esters of N-hydroxyphthalimide and N-hydroxynaphthalimide; diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl) diphenylsulfonium trifluoromethanesulfonate, (p-tert-butylphenyl)diphenylsulfonium trifluoromethanesulfonate, and other onium salts; benzoin tosylate, α-methylbenzoin tosylate, and other benzoin tosylates; and other diphenyliodonium salts, triphenylsulfonium salts, phenyldiazonium salts, and benzyl carbonate.

Among these compounds, preferred ingredients (B) are compounds each having at least two oxime sulfonate groups represented by the following formula:

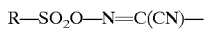

R—SO$_2$O—N=C(CN)— wherein R is, for example, a substituted or unsubstituted alkyl group containing from 1 to 8 carbon atoms or aryl group. Among them, typically preferred are compounds represented by the following formula:

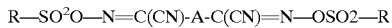

R—SO$^2$O—N=C(CN)-A-C(CN)=N—OSO2—R wherein A is a divalent group such as a substituted or unsubstituted alkylene group containing from 1 to 8 carbon atoms or an aromatic compound group; and R is, for example, a substituted or unsubstituted alkyl group containing from 1 to 8 carbon atoms or aryl group. The term "aromatic compound group" as used herein means and includes groups of compounds exhibiting physical and chemical properties specific to aromatic compounds, such as phenyl group, naphthyl group, and other aromatic hydrocarbon groups; and furyl group, thienyl group, and other heterocyclic groups. These groups may each have one or more appropriate substituents on its ring. Such substituents include, for example, halogen atoms, alkyl groups, alkoxy groups, and nitro group. Compounds of the above formula, in which A is a phenylene group and R is a lower alkyl group containing from 1 to 4 carbon atoms, are typically preferred.

The content of the ingredient (B) in the composition is preferably from 0.01 to 5 parts by weight, and more preferably from 0.1 to 1 part by weight, relative to 100 parts by weight of the total amount of the ingredients (A), (B), and (C). If the content of the ingredient (B) is less than 0.01 part by weight, the composition may not sufficiently be crosslinked and cured by heat or light, and the resulting thick film may have deteriorated plating resistance, chemical resistance and adhesion or the resulting bumps may have deteriorated shapes. In contrast, if it exceeds 5 parts by weight, the composition may induce imperfect development upon developing procedure.

When the chemically amplified negative photoresist composition for the formation of thick films contains the ingredient (B) in a content of from 0.1 to 1 part by weight relative to 100 parts by weight of the ingredients (A), (B), and (C), the composition can have well-balanced properties.

Compounds (C) Which Serves as a Crosslinking Agent in the Presence of Acid

Compounds (crosslinking agents) for use as the ingredient (C) in the present invention include, but are not limited to, conventional crosslinking agents such as amino compounds including melamine resins, urea resins, guanamine resins, glycoluril-formaldehyde resins, succinamide-formaldehyde resins, and ethylene urea-formaldehyde resins. Among them, alkoxymethylated melamine resins, alkoxymethylated urea resins and other alkoxymethylated amino resins are preferred. The alkoxymethylated amino resins can be prepared, for example, in the following manner. Specifically, melamine or urea is allowed to react with formaldehyde in a boiling water to thereby yield a condensate, the condensate is then converted into an ether with a lower alcohol such as methyl alcohol, ethyl alcohol, propyl alcohol, butyl alcohol or isopropyl alcohol, and the resulting reaction mixture is cooled to thereby precipitate an alkoxymethylated amino resin. Examples of the alkoxymethylated amino resins are methoxymethylated melamine resins, ethoxymethylated melamine resins, propoxymethylated melamine resins, butoxymethylated melamine resins, methoxymethylated urea resins, ethoxymethylated urea resins, propoxymethylated urea resins, and butoxymethylated urea resins. Each of these alkoxymethylated amino resins can be used alone or in combination. Among them, alkoxymethylated melamine resins can stably pattern resists with less changes in dimensions of the patterned resists with changes in dose of the active light or radiant ray and are preferred, of which methoxymethylated melamine resins, ethoxymethylated melamine resins, propoxymethylated melamine resins and butoxymethylated melamine resins are specifically preferred.

The content of the ingredient (C) is preferably from 1 to 30 parts by weight relative to 100 parts by weight of the total amount of the ingredients (A), (B), and (C). If the content of the ingredient (C) is less than 1 part by weight, the resulting thick film may have deteriorated plating resistance, chemical resistance and adhesion or the resulting bumps may have deteriorated shapes. In contrast, if it exceeds 30 parts by weight, the resist film may not satisfactorily developed upon developing process.

The thick-film chemically amplified negative photoresist composition of the present invention may further comprise an appropriate organic solvent for the adjustment of its viscosity. Such organic solvents include, but are not limited to, ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclohexanone, methyl propionate, ethyl propionate, propyl propionate, isopropyl propionate, methyl 2-hydroxypropionate, ethyl 2-hydroxypropionate, methyl 2-hydroxy-2-methylpropionate, methyl 3-methoxypropionate, ethyl 3-methoxypropionate, ethyl 3-ethoxypropionate, ethyl 3-propoxypropionate, propyl 3-methoxypropionate, isopropyl 3-methoxypropionate, ethyl ethoxyacetate, ethyl hydroxyacetate, methyl 2-hydroxy-3-methylbutanoate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, ethyl benzoate, diethyl oxalate, diethyl maleate, y-butyrolactone, benzene, toluene, xylene, cyclohexanone, methanol, ethanol, propanol, butanol, hexanol, cyclohexanol, ethylene glycol, diethylene glycol, and glycerol. Each of these solvents can be used alone or in combination.

In order to form films of at least 20 μm thick by spin coating the resulting negative photoresist composition, the solvent is preferably used in an amount that provides a solid matter concentration of from 35% to 65% by weight. If the solid matter concentration is less than 35% by weight, thick films suitable as materials for the formation of bumps may not be obtained. If it exceeds 65% by weight, the composition may have so extremely poor fluidity that it can be handled with difficulty and moreover makes it difficult to obtain uniform resist films by spin coating.

Where necessary, the composition of the present invention may further comprise quenchers such as triethylamine, tributylamine, dibutylamine, triethanolamine, and other secondary or tertiary amines.

Optionally, the composition of the present invention may further comprise an adhesion assistant to improve adhesion with the substrate. Preferred adhesion assistants are functional silane coupling agents. The term "functional silane coupling agents" as used herein means and includes silane coupling agents each having a reactive substituent such as a carboxyl group, methacryloyl group, isocyanate group or epoxy group. Such functional silane coupling agents include, but are not limited to, trimethoxysilylbenzoic acid, γ-methacryloyloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane. The proportion of the adhesion assistant is preferably less than or equal to 20 parts by weight relative to 100 parts by weight of the ingredient (A).

To finely adjust the solubility to an alkali developing solution, the composition of the present invention may comprise an acid or acid anhydride and/or a high boiling solvent. Such acids or acid anhydrides include, but are not limited to, monocarboxylic acids such as acetic acid, propionic acid, n-butyric acid, iso-butyric acid, n-valeric acid, iso-valeric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polycarboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, and 1,2,5,8-napthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bisanhydrotrimellitate, and glycerol trisanhydrotrimellitate. The high boiling solvents include, but are not limited to, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate. The amount of such a substance is not specifically limited and may be set in accordance with purposes and coating processes of the resulting composition, as long as the composition can be uniformly mixed. In general, the amount of the substance is preferably less than or equal to 60% by weight, and more preferably less than or equal to 40% by weight, based on the weight of the resulting composition.

The composition of the present invention may further comprise other additives such as a coloring agent according to necessity. The coloring agent includes, but is not limited to, extender pigments such as alumina white, clay, barium carbonate and barium sulfate; inorganic pigments such as zinc white, white lead, chrome yellow, red lead, ultramarine blue, iron blue, titanium oxide, zinc chromate, red iron oxide and carbon black; organic pigments such as Brilliant Carmine 6B, Permanent Red 6B, Permanent Red R, Benzidine Yellow, Phthalocyanine Blue and Phthalocyanine Green; basic dyes such as magenta and rhodamine; direct dyes such as Direct Scarlet and Direct Orange; and acid dyes such as Rhocerin and Metanil Yellow.

These additives may be used in such an amount that they do not deteriorate the essential properties of the composition, and preferably less than or equal to 50% by weight based on the weight of the resulting composition.

The composition of the present invention may be prepared by only mixing and stirring the materials according to a conventional procedure. Where necessary, the materials may be dispersed and mixed by means of a dispersion machine such as a dissolver, a homogenizer or a three-roll mill, further optionally followed by filtration using a mesh filter or a membrane filter.

The composition of the present invention is suitable for the formation of thick films and can also be used in, for example, protective films formed when various substrates such as copper, chromium, iron and glass substrates are etched, and resists for semiconductor fabrication. Using the composition of the present invention as a thick resist film, bumps can be formed, for example, in the following manner.

(1) Formation of Coating: A solution of the composition prepared as described above is applied to a substrate having a predetermined wiring pattern, and the applied film is heated (prebaked) to remove the solvent to form a coating. To apply the composition to the substrate, a process such as spin coating, roll coating, screen printing or applicator coating may be employed. Prebaking conditions may differ depending on the types of the respective components in the composition, their mixing proportion and the coating layer thickness. Usually the prebaking may be carried out at 70° C. to 130° C., and preferably 80° C. to 120° C., for about 2 to about 60 minutes.

(2) Exposure to Radiant Rays: The coating thus formed is exposed to radiant rays such as ultraviolet rays or visible light rays of 300 to 500 nm in wavelength through a mask with a predetermined pattern, to expose the coating only at its wiring pattern areas on which bumps are to be formed. Such radiation sources include, for example, low-pressure mercury lamps, high-pressure mercury lamps, ultrahigh-pressure mercury lamps, metal halide lamps, and argon gas lasers. The radiant rays to which the coating is exposed are, for example, ultraviolet rays, visible light rays, far ultraviolet rays, X-rays and electron beams.

Radiation dose may differ depending on the types of the respective components in the composition, their mixing proportion and the coating layer thickness. For example, when the ultrahigh-pressure mercury lamps are used, the radiation dose is from 100 to 2000 mJ/cm$^2$.

(3) Heating: After the exposure to radiant rays, the coating is heated according to a conventional procedure.

(4) Development: After heating, the pattern is developed by dissolving and removing the unexposed unnecessary areas, using an alkaline solution as a developing solution, to make only the radiation-exposed areas remain. As the developing solution, an aqueous solution of a basic compound may be used. Such basic compounds include, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane. An aqueous solution prepared by adding a water-soluble organic solvent, such as methanol or ethanol, or a surfactant to the aqueous solution of any of these basic compounds may also be used as the developing solution.

Development time may differ depending on the types of the respective components in the composition, their mixing proportion and the dried coating thickness of the composition. Usually development may be carried out for 1 to 30 minutes, and may be carried out by any of dispensing development, dip development, puddle development and spray development. After the development, the substrate is rinsed with running water for 30 to 90 seconds, followed by air drying by means of an air gun or drying in an oven.

The plating process is not specifically limited, and any conventional plating processes can be used. As the plating solution, a solder plating solution and a copper plating solution can advantageously be used.

A film obtained by using the composition of the present invention may have a thickness of from 20 to 150 $\mu$m, preferably from 30 to 120 $\mu$m and more preferably from 40 to 90 $\mu$m. If the thickness is less than 20 $\mu$m or exceeds 150 $\mu$m, the resulting film cannot satisfy the required properties.

EXAMPLES

The present invention will be illustrated in further detail with reference to several examples and comparative examples below, which are not intended to limit the scope of the invention. All parts and percentages are by weight unless otherwise specified.

Preparation of Alkali-Soluble Resins (A)

Preparation Example 1

Sixty parts of m-cresol was added to forty parts of p-cresol, the resulting mixture was condensed with formaldehyde (as formalin) using an oxalic acid catalyst according to a conventional procedure and thereby yielded a cresol novolak resin. Low molecular weight fractions of the resin were removed by fractionation to yield a novolak resin having a weight average molecular weight of 10000 (Novolak Resin A1).

Preparation Example 2

Formaldehyde was added to m-cresol, the resulting mixture was condensed using an oxalic acid catalyst according to a conventional procedure and thereby yielded a m-cresol novolak resin. Low molecular weight fractions of the resin were removed by fractionation to yield a novolak resin having a weight average molecular weight of 6000 (Novolak Resin A2).

Example 1

In 150 parts of propylene glycol methyl ether acetate were dissolved 90 parts of Novolak Resin A1 (a1), 10 parts of a homopolymer of hydroxystyrene (a2) having a weight average molecular weight of 2500 (available from Nippon Soda Co., Ltd. under the trade name of UP-2500), 0.5 part of an acid generator (B) represented by the following formula, and 10 parts of hexamethoxymethylated melamine (available from Sanwa Chemical Co., Ltd. under the trade name of Nikalac Mw-100) as a crosslinking agent (C), the resulting solution was filtrated through a membrane filter having a pore size of 1.0 μm and thereby yielded a negative photoresist composition. The properties of this composition were determined according to procedures mentioned later. The results are shown in Table 1.

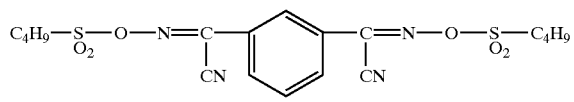

Example 2

A negative photoresist composition was prepared in the same manner as in Example 1, except that the ingredient (a1) was changed to Novolak Resin A2. The properties of this composition were determined according to procedures mentioned later. The results are shown in Table 1.

Example 3

A negative photoresist composition was prepared in the same manner as in Example 1, except that 50 parts of Novolak Resin A2 and 50 parts of a homopolymer of hydroxystyrene having a weight average molecular weight of 2500 (available from Nippon Soda Co., Ltd. under the trade name of UP-2500) were used as the ingredients (a1) and (a2), respectively. The properties of this composition were determined according to procedures mentioned later. The results are shown in Table 1.

Example 4

A negative photoresist composition was prepared in the same manner as in Example 2, except that the ingredient (B) was changed to 1 part of tris(2,3-dibromopropyl) isocyanurate. The properties of this composition were determined according to procedures mentioned later. The results are shown in Table 1.

Example 5

A negative photoresist composition was prepared in the same manner as in Example 2, except that the ingredient (B) was changed to 1 part of an acid generator represented by the following formula. The properties of this composition were determined according to procedures mentioned later. The results are shown in Table 1.

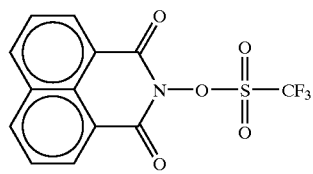

Comparative Example 1

A negative photoresist composition was prepared in the same manner as in Example 1, except that the ingredient (a2) homopolymer of hydroxystyrene was not used. The properties of this composition were determined according to procedures mentioned later. The results are shown in Table 2.

Comparative Example 2

A negative photoresist composition was prepared in the same manner as in Example 1, except that 20 parts of a photosensitive reaction initiator was used as the acid generator (B) and the crosslinking agent (C), which photosensitive reaction initiator was obtained by allowing 1 mole of a compound represented by following formula (1) to react with 2 moles of 1,2-naphthoquinonediazido-4-sulfonyl chloride. The properties of this composition were determined according to procedures mentioned later. The results are shown in Table 2.

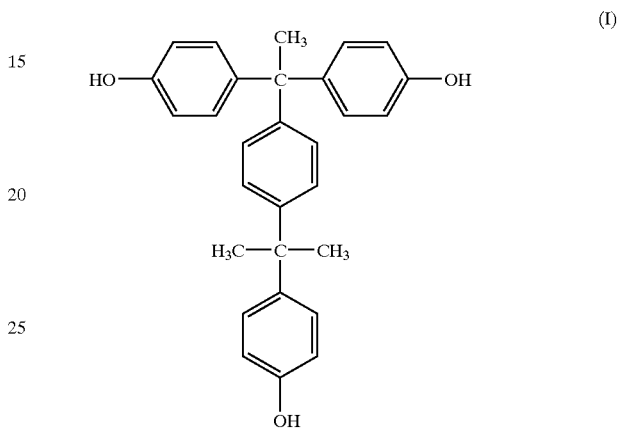

(I)

Determination of Properties (i) Compatibility

A sample negative photoresist composition was stirred for 12 hours, and the state of the solution immediately after stirring and upon leaving for 12 hours after the completion of stirring was visually observed. How it stood as a dispersion was determined according to the following criteria:

Good: The composition was seen to have been uniformly dissolved immediately after stirring, and also seen to be in the uniformly dissolved state even after 12 hours.

Fair: The composition was seen to have been uniformly dissolved immediately after stirring, but seen to have caused phase separation after 12 hours.

Poor: The composition was not in the uniformly dissolved state even immediately after stirring.

(ii) Coating Property

The above negative photoresist composition used in the test (i) was applied to a 5 inch gold-sputtered silicon wafer by means of a spinner at 1000 rpm for 25 seconds, and the coating formed was heated on a hot plate at 110° C. for 6 minutes. The surface of the dry film was visually observed to determine coating property according to the following criteria:

Good: The film formed was free of unevenness and was uniform.

Poor: The film formed had unevenness such as pinholes and cissing.

(iii) Developing Property and Definition

The sample negative photoresist composition was applied to a 5-inch silicon wafer by means of a spinner at 1800 rpm for 25 seconds, and the coating formed was prebaked on a hot plate at 110° C. for 6 minutes and thereby yielded a coating about 20 μm thick.

Separately, the sample negative photoresist composition was applied to a 5 inch silicon wafer using a spinner at 800 rpm for 25 seconds, the coating formed was prebaked on a hot plate at 110° C. for 1 minute, the negative photoresist composition was further coated thereon using the spinner at 800 rpm for 25 seconds, and the resulting coating was prebaked on the hot plate at 110° C. for 9 minutes and thereby yielded a coating about 65 µm thick.

Further separately, the sample negative photoresist composition was applied to a 5 inch silicon wafer using a spinner at 800 rpm for 25 seconds, the coating formed was prebaked on a hot plate at 110° C. for 1 minute, the negative photoresist composition was further coated thereon using the spinner at 800 rpm for 25 seconds, and the coating was prebaked on the hot plate at 110° C. for 1 minute, the negative photoresist composition was further coated thereon using the spinner at 800 rpm for 25 seconds, the resulting coating was further prebaked on the hot plate at 110° C. for 13 minutes and thereby yielded a coating about 120 µm thick.

Next, through a patterned mask for measuring definition, the coating, which was formed on one sheet of coated substrate dividedly in plural regions using a stepper (available from Ultratech under the trade name of Saturn Spectrum 3 Wafer Stepper), was exposed to ultraviolet rays at radiation doses ranging from 200 mJ/cm$^2$ to 3000 mJ/cm$^2$, respectively. The exposed substrate was heated at 110° C. for 6 minutes and was then subjected to development using a developing solution (available from Tokyo Ohka Kogyo Co., Ltd. under the trade name of PMER Series P-7G). The resulting film was rinsed with running water, followed by nitrogen blowing to yield a patternwise cured product. This was observed on an optical microscope to determine the definition according to the following criteria:

Good: A hole pattern 5 µm square had been resolved at any of the above radiation doses and no residue was observed.

Poor: A hole pattern 5 µm square had not been resolved or any residue was observed.

In this procedure, an aspect ratio was also determined. The aspect ratio is defined as the ratio of the resist height on the pattern to the resist width on the pattern.

(iv) Plating Resistance

The substrate having the patternwise cured product prepared in the above test (iii) was made into test materials. The test materials were subjected to ashing with oxygen plasma, was immersed in a copper sulfite plating solution at 40° C. for 3 hours, was then rinsed with running water and thereby yielded processed test materials. The processed test materials were observed on an optical microscope or an electron microscope to examine how the patternwise cured product stood, to determine the shape of the bumps and the plating solution resistance of the patternwise cured product according to the following criteria.

Good: The bumps and the patternwise cured product showed no particular changes.

Poor: Cracks, bulges or chips occurred in the patternwise cured product or the patternwise cured product had a rough surface.

(v) Bump Shape

Processed test materials were prepared in the same manner as in the test (iv) and were observed on an optical microscope or an electron microscope to examine the shapes of the bumps according to the following criteria. When the bump shape was good, an error ratio of the angle between the substrate and bumps to the mask dimension.

Good: The shapes of the bumps were good and were in accordance with that of the patternwise cured product.

Poor: The shapes of the bumps were not in accordance with that of the patternwise cured product and induced bulging.

(vi) Releasability

The substrates each carrying the patternwise cured product obtained in the test (iii) were used as test materials, were immersed in a stirred stripper (available from Tokyo Ohka Kogyo Co., Ltd. under the trade name of Stripper 710) at 70° C. for 10 minutes, were rinsed with an alcohol to thereby remove the patternwise cured product. The resulting substrates were observed visually or on an optical microscope to examine the releasability of the patternwise cured product according to the following criteria:

Good: No residue of the patternwise cured product remained on the substrate.

Poor: The residue of the patternwise cured product remained on the substrate.

(vii) Photosensitivity

The sample negative photoresist composition was applied to a 5-inch silicon wafer and thereby yielded a coating about 40 µm thick. Next, through a patterned mask for measuring definition, the coating, which was formed on one sheet of coated substrate dividedly in plural regions using a stepper (available from Ultratech under the trade name of Saturn Spectrum 3 Wafer Stepper), was exposed to ultraviolet rays at doses ranging from 200 mJ/cm$^2$ to 10000 mJ/cm$^2$, respectively. The exposed substrate was heated at 110° C. for 6 minutes and was then subjected to development using a developing solution (available from Tokyo Ohka Kogyo Co., Ltd. under the trade name of PMER Series P-7G). The resulting film was rinsed with running water, followed by nitrogen blowing to yield a patternwise cured product. This was observed on an optical microscope. In this procedure, the photosensitivity was defined as the dose at which a hole pattern 5 µm square was resolved and no residue was observed.

TABLE 1

|  | Ex. 1 | Ex. 2 | Ex. 3 | Ex. 4 | Ex. 5 | | | |
|---|---|---|---|---|---|---|---|---|
| Compatibility | Good | Good | Good | Good | Good | Good | Good | Good |
| Coating property | Good | Good | Good | Good | Good | Good | Good | Good |
| Film thickness (µm) | 20 | 65 | 20 | 65 | 120 | 65 | 65 | 65 |
| Developing property and definition | Good | Good | Good | Good | Good | Good | Good | Good |
| Aspect ratio | 2 | 1 | 3 | 3 | 3 | 2 | 1 | 3 |
| Plating solution resistance | Good | Good | Good | Good | Good | Good | Good | Good |
| Bump shape | Good | Good | Good | Good | Good | Good | Good | Good |
| Releasability | Good | Good | Good | Good | Good | Good | Good | Good |
| Photosensitivity (mJ/cm$^2$) | 1000 | 3000 | 1000 | 1500 | 2500 | 1000 | 3000 | 1500 |

TABLE 2

|  | Com. Ex. 1 | Com. Ex. 2 |
|---|---|---|
| Compatibility | Good | Good |
| Coating property | Good | Good |
| Film thickness (µm) | 65 | 65 |
| Developing property and definition | Poor | Poor |
| Aspect ratio | 2 | >1 |
| Plating solution resistance | Good | Poor |

TABLE 2-continued

|  | Com. Ex. 1 | Com. Ex. 2 |
| --- | --- | --- |
| Bump shape | Good | Poor |
| releasability | Good | Good |
| Photosensitivity (mJ/cm$^2$) | 1000 | 10000 |

Note: Table 2 shows that the composition according to Comparative Example 2 exhibited markedly low photosensitivity.

Other embodiments and variations will be obvious to those skilled in the art, and this invention is not to be limited to the specific matters stated above.

What is claimed is:

1. A thick film of a chemically amplified negative photoresist composition, comprising:
    (A) an alkali-soluble resin comprising:
        (a1) a novolak resin having a weight average molecular weight of from 5000 to 10000; and
        (a2) a polymer containing at least a hydroxystyrene constitutional unit and having a weight average molecular weight of less than or equal to 5000;
    (B) a compound which generates an acid upon irradiation with active light or radiant ray; and
    (C) a compound which serves as a crosslinking agent in the presence of an acid;
    wherein the thick film has a thickness of from 20 to 150 μm.

2. The thick film according to claim 1 wherein the novolak resin (a1) is a m-cresol novolak resin obtained by condensation of m-cresol and an aldehyde in the presence of an acid catalyst.

3. The thick film according to claim 1 wherein the ingredient (A) comprises 50 to 98 parts by weight of the novolak resin (a1) and 50 to 2 parts by weight of the polymer (a2) based on 100 parts by weight of the total weight of the novolak resin (a1) and the polymer (a2).

4. The thick film according to claim 1 wherein the ingredient (B) is a compound having at least two oxime sulfonate groups represented by the following formula:

R—SO$_2$O—N=C(CN)— wherein R is a substituted or unsubstituted alkyl group or aryl group.

5. The thick film according to claim 4 wherein the ingredient (B) is a compound represented by the following formula:

R—SO$_2$O—N=C(CN)-A-C(CN)=N—OSO$_2$—R wherein A is a divalent organic group; and R is a substituted or unsubstituted alkyl group or aryl group.

6. The thick film according to claim 5 wherein the group A is a phenylene group and the substituent R is a lower alkyl group in the formula of the ingredient (B).

7. The thick film according to claim 1 wherein the content of the ingredient (B) is from 0.1 to 1 part by weight based on 100 parts by weight of the total weight of the ingredients (A), (B) and (C).

8. A negative photoresist base material comprising:
    a substrate; and
    a negative photoresist layer formed on the substrate, comprising a chemically amplified negative photoresist composition for the formation of thick films, comprising:
        (A) an alkali-soluble resin comprising:
            (a1) a novolak resin having a weight average molecular weight of from 5000 to 10000; and
            (a2) a polymer containing at least a hydroxystyrene constitutional unit and having a weight average molecular weight of less than or equal to 5000;
        (B) a compound which generates an acid upon irradiation with active light or radiant ray: and
        (C) a compound which serves as a crosslinking agent in the presence of an acid,
    and having a film thickness of from 20 to 150 μm.

9. A method of forming bumps, the method comprising the steps of:
    applying a chemically amplified negative photoresist composition for the formation of thick films, comprising:
        (A) an alkali-soluble resin comprising:
            (a1) a novolak resin having a weight average molecular weight of from 5000 to 10000; and
            (a2) a polymer containing at least a hydroxystyrene constitutional unit and having a weight average molecular weight of less than or equal to 5000;
        (B) a compound which generates an acid upon irradiation with active light or radiant ray; and
        (C) a compound which serves as a crosslinking agent in the presence of an acid,
    to a substrate of an electronic part to thereby form a resist film having a film thickness of from 20 to 150 μm;
    selectively exposing the resist film;
    heating the exposed resist film;
    developing the heated resist film to thereby form a negative resist pattern; and
    plating the portions from which the resist film has been removed using the resist pattern as a mask.

10. The negative photoresist base material according to claim 8 wherein the novolak resin (a1) is a m-cresol novolak resin obtained by condensation of m-cresol and an aldehyde in the presence of an acid catalyst.

11. The negative photoresist base material according to claim 8 wherein the ingredient (A) comprises 50 to 98 parts by weight of the novolak resin (a1) and 50 to 2 parts by weight of the polymer (a2) based on 100 parts by weight of the total weight of the novolak resin (a1) and the polymer (a2).

12. The negative photoresist base material according to claim 8 wherein the ingredient (B) is a compound having at least two oxime sulfonate groups represented by the following formula:

R—SO$_2$O—N=C(CN)— wherein R is a substituted or unsubstituted alkyl group or aryl group.

13. The negative photoresist base material according to claim 12 wherein the ingredient (B) is a compound represented by the following formula:

R—SO$_2$O—N=C(CN)-A-C(CN)=N—OSO$_2$—R wherein A is a divalent organic group; and R is a substituted or unsubstituted alkyl group or aryl group.

14. The negative photoresist base material according to claim 13 wherein the group A is a phenylene group and the substituent R is a lower alkyl group in the formula of the ingredient (B).

15. The negative photoresist base material according to claim 8 wherein the content of the ingredient (B) is from 0.1 to 1 part by weight based on 100 parts by weight of the total weight of the ingredients (A), (B) and (C).

16. The method of forming bumps according to claim 9 wherein the novolak resin (a1) is a m-cresol novolak resin obtained by condensation of m-cresol and an aldehyde in the presence of an acid catalyst.

17. The method of forming bumps according to claim 9 wherein the ingredient (A) comprises 50 to 98 parts by weight of the novolak resin (a1) and 50 to 2 parts by weight of the polymer (a2) based on 100 parts by weight of the total weight of the novolak resin (a1) and the polymer (a2).

18. The method of forming bumps according to claim 9 wherein the ingredient (B) is a compound having at least two oxime sulfonate groups represented by the following formula:

$$R-SO_2O-N=C(CN)-$$

wherein R is a substituted or unsubstituted alkyl group or aryl group.

19. The method of forming bumps according to claim 18 wherein the ingredient (B) is a compound represented by the following formula:

$$R-SO_2O-N=C(CN)-A-C(CN)=N-OSO_2-R$$

wherein A is a divalent organic group; and R is a substituted or unsubstituted alkyl group or aryl group.

20. The method of forming bumps according to claim 19 wherein the group A is a phenylene group and the substituent R is a lower alkyl group in the formula of the ingredient (B).

21. The method of forming bumps according to claim 9 wherein the content of the ingredient (B) is from 0.1 to 1 part by weight based on 100 parts by weight of the total weight of the ingredients (A), (B) and (C).

* * * * *